(12) United States Patent
Hsu

(10) Patent No.: US 6,495,401 B1
(45) Date of Patent: Dec. 17, 2002

(54) METHOD OF FORMING AN ULTRA-THIN SOI MOS TRANSISTOR

(75) Inventor: Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 42 days.

(21) Appl. No.: 09/687,829

(22) Filed: Oct. 12, 2000

(51) Int. Cl.$^7$ .................... H01L 21/00; H01L 21/84
(52) U.S. Cl. .................. 438/149; 438/300; 438/311
(58) Field of Search ................. 257/347, 348, 257/349, 382, 412; 438/149, 199, 300, 311, 479, 517

(56) References Cited

U.S. PATENT DOCUMENTS

| | | | |
|---|---|---|---|
| 4,471,522 A | 9/1984 | Jambotkar | 29/571 |
| 5,376,578 A | 12/1994 | Hsu et al. | 437/56 |
| 5,491,099 A | 2/1996 | Hsu | 437/35 |
| 5,516,710 A | 5/1996 | Boyd et al. | 437/31 |
| 5,756,391 A * | 5/1998 | Tsuchiaki | 438/592 |
| 5,828,103 A | 10/1998 | Hsu | 257/344 |
| 5,830,775 A | 11/1998 | Maa et al. | 437/41 |
| 5,866,459 A | 2/1999 | Naem et al. | 438/300 |
| 5,915,183 A | 6/1999 | Gambino et al. | 438/300 |
| 5,918,132 A | 6/1999 | Qian et al. | 438/299 |
| 6,043,129 A * | 3/2000 | Choi et al. | 438/300 |
| 6,271,541 B2 * | 8/2001 | Yamaguchi et al. | 257/347 |
| 6,328,796 B1 * | 12/2001 | Kub et al. | 117/915 |

* cited by examiner

Primary Examiner—Olik Chaudhuri
Assistant Examiner—Hoai Pham
(74) Attorney, Agent, or Firm—David C. Ripma; Matthew D. Rabdau; Scott C. Krieger

(57) ABSTRACT

A transistor structure includes a main gate silicon active region having a thickness of less than or equal to 30 nm; and auxiliary gate active regions located on either side of said main gate silicon active region, said auxiliary gate active regions being spaced a distance from said main gate active region of about 200 nm. A method of forming an ultra-thin SOI MOS transistor includes preparing a silicon wafer, including forming a top silicon layer having a thickness of between about 100 nm to 200 nm, thinning the top silicon layer to a thickness of between about 10 nm to 30 nm, and forming an oxide layer over the top silicon layer; forming a layer of material taken from the group of material consisting of polysilicon and silicide; forming an oxide cap on the formed layer of material, and etching the oxide cap and layer of material to form a main gate electrode and an auxiliary gate electrode on either side thereof; forming an oxide layer over the structure and etching the oxide layer to form sidewall oxide structures about the gate electrodes; depositing a layer of material taken from the group of material consisting of polysilicon, silicide and metal, etching the newly deposited layer of material; and metallizing the structure.

5 Claims, 3 Drawing Sheets

METHOD OF FORMING AN ULTRA-THIN SOI MOS TRANSISTOR

RELATED APPLICATION

This application is related to Ser. No. 09/497,626, filed Feb. 3, 2000 of Hsu et al. for Raised suicide source/drain MOS transistor having enlarged source/drain contact region and method.

FIELD OF THE INVENTION

This invention relates to CMOS fabrication on ultra-thin silicon-on-insulator (SOI), and specifically to a method and structure for preserving an ultra-thin silicon layer during fabrication.

BACKGROUND OF THE INVENTION

When the thickness of a top silicon layer approaches 20 nm, a gate sidewall etching process produces a high density of voids in the silicon in the source/drain regions. This high density of voids degrades the performance of the device and production yield. This problem becomes more severe as the top silicon thickness is reduced, which is required in shorter channel length device fabrication.

Two techniques are known in the prior art for fabrication of ultra-thin SOI MOS transistors. The first technique requires nitride protection of a gate area and local oxidation of silicon (LOCOS) to provide a thin gate area. For ultra-thin SOI transistor fabricated by LOCOS, the thinned gate region has to be larger than the gate length by at least one alignment tolerance. The thickness of the sidewall oxide has to be larger than two alignment tolerances otherwise the silicon in this region will be completely removed during sidewall oxide etching, causing a disconnection between the source/drain regions and the channel region. However, the resistance of a thin or ultra-thin drain extension region, once formed by LOCOS, is too large for efficient use in high performance devices.

The second technique is used for conventional SOI device fabrication and requires a raised source/drain process. Such a raised source/drain process requires a seed silicon layer. Without such a seed silicon layer, selective growth of silicon cannot be accomplished. However, when the thickness of the top silicon is very thin, e.g., no thicker than 10 nm, all of the silicon in the source and drain region will be completely removed during any etching process for gate oxide sidewall formation. As a result, selective silicon growth cannot occur and the source/drain regions cannot be formed.

SUMMARY OF THE INVENTION

A transistor structure includes a main gate silicon active region having a thickness of less than or equal to 30 nm; and auxiliary gate active regions located on either side of said main gate silicon active region, said auxiliary gate active regions being spaced a distance from said main gate active region of about 200 nm. A method of forming an ultra-thin SOI MOS transistor includes preparing a silicon wafer, including forming a top silicon layer having a thickness of between about 200 nm to 100 nm, thinning the top silicon layer to a thickness of between about 10 nm to 30 nm, and forming an oxide layer over the top silicon layer; forming a layer of material taken from the group of material consisting of polysilicon and silicide; forming an oxide cap on the formed layer of material, and etching the oxide cap and layer of material to form a main gate electrode and an auxiliary gate electrode on either side thereof; forming an oxide layer over the structure and etching the oxide layer to form sidewall oxide structures about the gate electrodes; depositing a layer of material taken from the group of material consisting of polysilicon, silicide and metal, etching the newly deposited layer of material; and metallizing the structure.

An object of the invention is to provide a method of fabricating an ultra-thin SOI MOS transistor having a top silicon layer less than 20 nm thick.

Another object of the invention is to provide a SOI MOS transistor which is reliable and has a good production yield.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENTS

When the thickness of a top silicon layer approaches 20 nm, a gate sidewall etching process produces a high density of voids in the silicon in the source/drain regions. This high density of voids degrades the performance of the device and production yield. This problem becomes more severe as the top silicon thickness is reduced, which is required in shorter channel length device fabrication. This invention provides a solution to this problem in addition to that disclosed in the above-identified related application.

Figure 1:
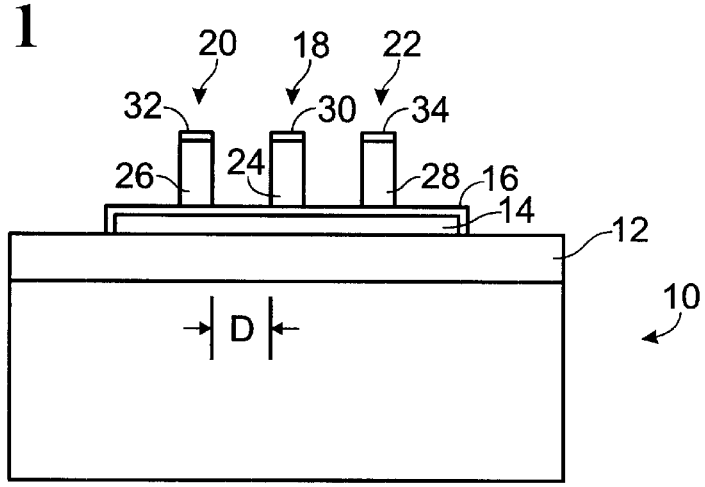
FIGS. 1–5 depict successive steps in the formation of a SOI MOS transistor according to a first embodiment of the invention.

The steps in fabricating a first embodiment of the MOS transistor according to the invention includes the following:

Referring initially to FIG. 1, a silicon wafer 10 has an oxide layer 12 formed thereon. A top silicon layer 14 is deposited by state of the art deposition techniques on oxide layer 12. Top silicon layer 14 is thinned by thermal oxidation, or etching, to the desired thickness, which is preferably between about 10 nm and 30 nm. Device isolation is accomplished by etching silicon islands for mesa isolation, or by a LOCOS process. The threshold voltage is adjusted by ion implantation into top silicon layer 14. Phosphorous ions, at a dose of between about $1 \cdot 10^{11}$ cm$^{-2}$ and $1 \cdot 10^{12}$ cm$^{-2}$, and an energy of 10 keV are implanted, as are boron ions, at a dose of between about $1 \cdot 10^{11}$ cm$^{-2}$ and $1 \cdot 10^{12}$ cm$^{-2}$, and an energy of 5 keV, to form N+ and P+ regions, respectively. An oxide layer 16 is then deposited in a gate oxidation step. Next, polysilicon is deposited by CVD, and an oxide cap is formed thereover. The oxide cap and the polysilicon are etched to form a main gate electrode, or active region, 18, and auxiliary gates, or active regions, 20, 22 are also formed at each side of the main gate electrode. Main gate 18 includes a polysilicon layer 24 and an oxide cap 30; auxiliary gate 20 includes a polysilicon layer 26 and an oxide cap 32; and auxiliary gate 22 includes a polysilicon layer 28 and an oxide cap 34. The distance between the auxiliary gates and the main gate is made as small as possible, generally on the order of 200 nm, as indicated by distance D. The resulting structure after the forgoing steps is depicted in FIG. 1.

Figure 2:
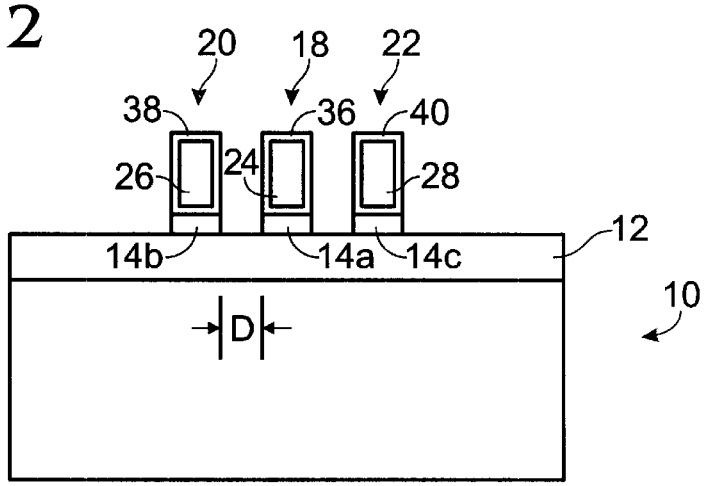

The next step in the process is CVD of oxide, or thermal oxidation, to form an oxide layer having a thickness of between about 10 nm to 50 nm. The oxide layer is etched to form sidewall oxide structures 36, 38 and 40 at gate electrode 18, 20 and 22, which sidewalls are a combination of the most recently deposited oxide, oxide layer 16, and oxide caps 30, 32 and 34, respectively. Because the top silicon is very thin, any silicon which is not covered by a gate electrode, and its associated sidewall oxide, may be removed during sidewall oxide etching, resulting in remaining silicon regions 14a, 14b and 14c., as depicted in FIG. 2.

Figure 3:
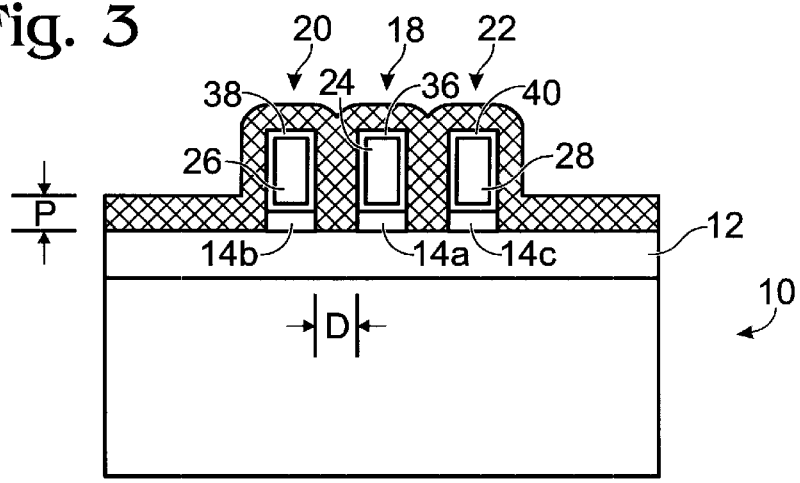

Referring now to FIG. 3, a layer of polysilicon 44, or silicide, is deposited by CVD. The thickness of the polysilicon or silicide layer is larger than one-half of the distance between main gate 18 and auxiliary gates 20, 22, generally on the order of 150 nm. It will be appreciated by those of ordinary skill in the art that the accompanying drawings are not drawn to scale. Polysilicon layer 44 is anisotropically etched to its endpoint, and may be over etched, from between about 20% to 150%, resulting in the remaining polysilicon, or silicide, being no thinner than about 50 nm, distance P in FIG. 3.

Figure 4:
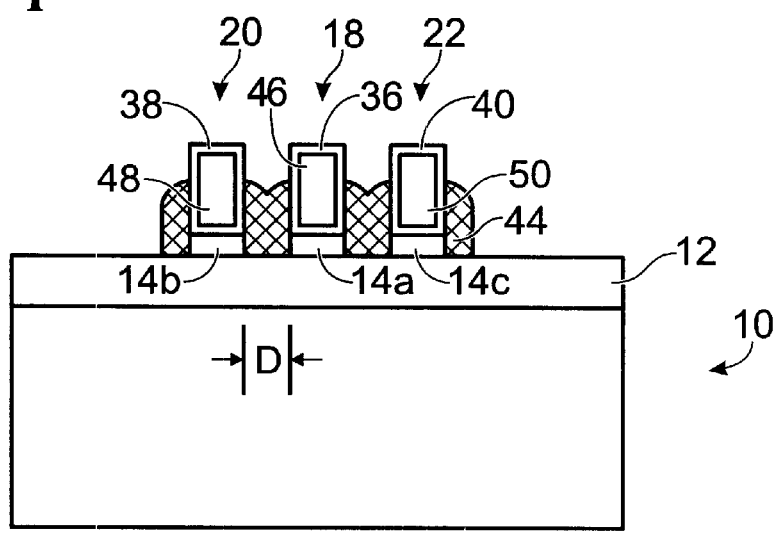
Figure 5:
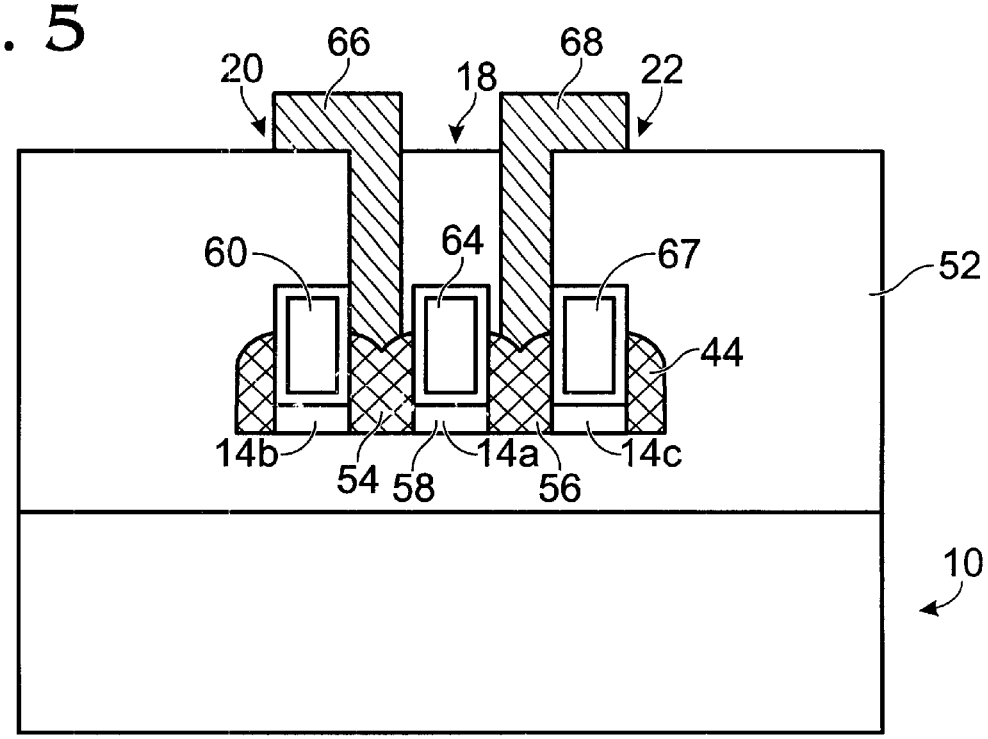

The active area is covered with photoresist, and the structure is plasma etched to remove polysilicon, or silicide, at the sidewall of the gate electrodes outside of the source and drain active regions. Ions are implanted to dope the sidewall polysilicon. Phosphorous ions (N+) at a dose of about $2 \cdot 10^{15}$ cm$^{-2}$ and an energy level of about 30 keV, are implanted to form an nMOST, or boron ions (P+) at a dose of about $2 \cdot 10^{15}$ cm$^{-2}$ and an energy level of about 15 keV, are implanted to form a pMOST. If silicide is used instead of polysilicon, this doping step is omitted. Referring now to FIG. 4, the ion implantation also converts polysilicon gate electrode into N+ or P+ silicon, as indicated at 46, 48 and 50. State-of-the-art CVD of an oxide layer 52 is the next step, followed by etching of contact holes, and metallization. The result is shown in FIG.5, which includes a source region 54 and a drain region 56. A main gate 58 is flanked by a left auxiliary gate 60 and a right auxiliary gate 62. Main gate 58 includes a gate electrode 64, while source 54 is connected to a source electrode 66 and drain 56 is connected to a drain electrode 68. The full metal interconnects to the main and auxiliary gates are not shown.

Figure 6:
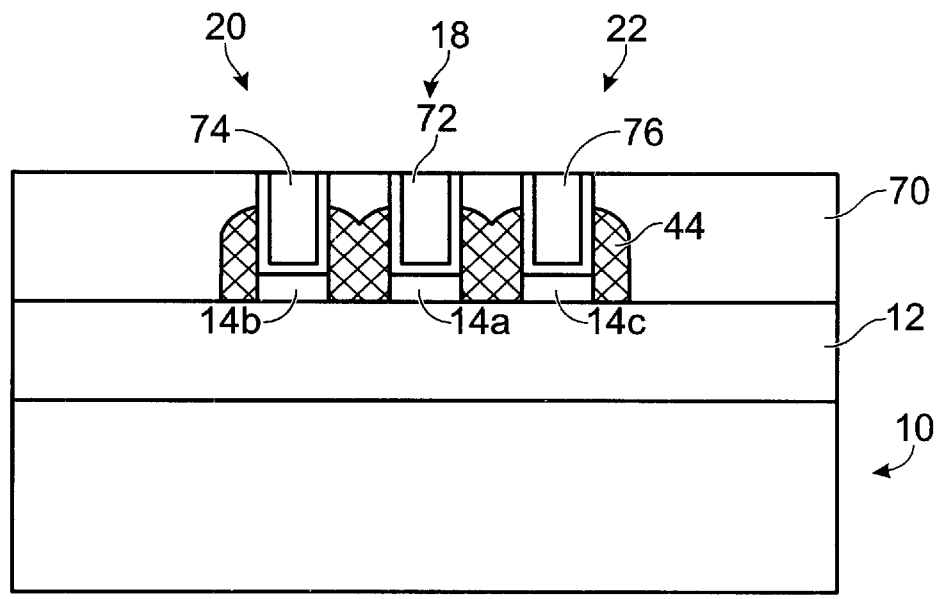
FIGS. 6 and 7 depict successive steps in the formation of a SOI MOS transistor according to a second embodiment of the invention.

Although the method of the first embodiment of the invention is illustrated using a dual-polarity polysilicon gate process, the method may also be used in a metal gate process. A metal gate may be formed by an etching process, with process steps identical to the polysilicon or silicide gate process as shown in FIGS. 1–5, except the polysilicon electrode is replaced with a metal, such as TiN2, W, WN2, Mo, MoSi2, TaSi2, etc. In the case of a replacement gate process, the previously described steps are followed and the polysilicon gate electrode is replaced with silicon nitride. Then, and using the reference numbers of FIGS. 1–5 where applicable, and now referring to FIG. 6, an oxide layer 70 is formed by CVD, and finished by CMP, stopping at the level of the polysilicon or silicon nitride. The polysilicon or silicon nitride is etched, with the sidewall polysilicon being over etched. At this step, the sidewall polysilicon is covered with oxide, and the etching step will not remove the sidewall polysilicon. Once the gate polysilicon or silicon nitride is etched, metal electrodes 72, 74 and 76 may be formed by CVD, followed by another CMP step to remove excess metal, as shown in FIG. 6.

Figure 7:
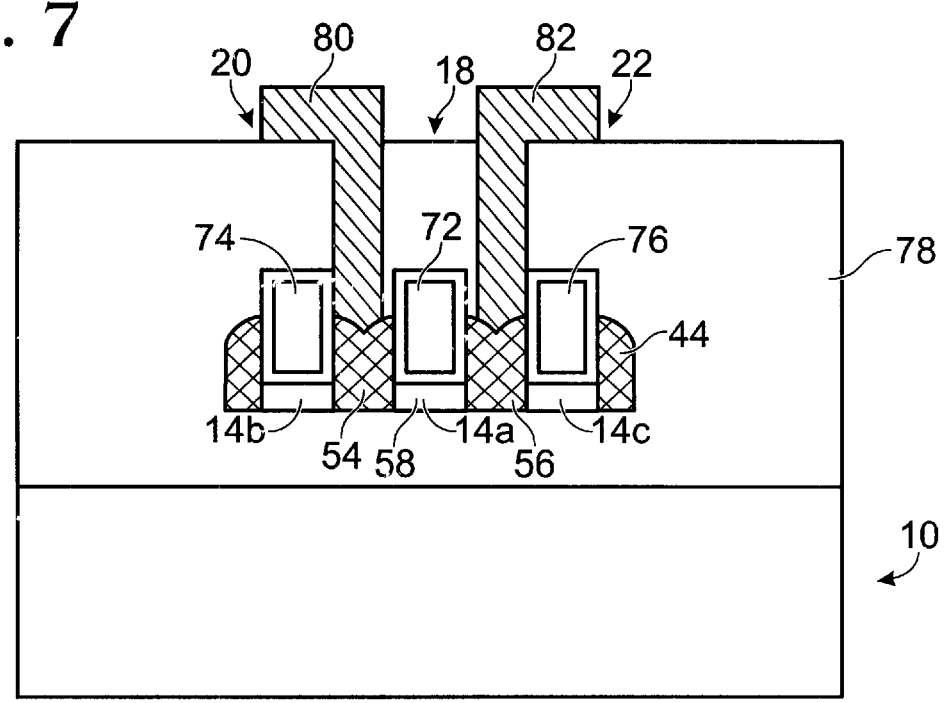

Referring now to FIG. 7, an oxide layer 78 is formed by CVD. Contact holes are formed by etching, and metallization results in source electrode 80 and drain electrode 82. Again, the full gate contacts are not shown for clarity.

Thus, a method and a structure for an ultra-thin SOI MOS transistor has been disclosed. It will be appreciated that further variations and modifications thereof may be made within the scope of the invention as defined in the appended claims.

I claim:

1. A method of forming an ultra-thin SOI MOS transistor structure comprising:

preparing a silicon-on-insulator (SOI) wafer, including forming a top silicon layer on the oxide surface of the SOI wafer having a thickness of between about 100 nm to 200 nm, thinning the top silicon layer to a thickness of between about 10 nm to 30 nm using a method taken from the group of methods consisting of thermal oxidation and etching, and forming an oxide layer over the top silicon layer;

forming a layer of material on the top silicon layer taken from the group of material consisting of polysilicon and silicide; forming an oxide cap on the formed layer of material, and etching the oxide cap and layer of material to form a main gate electrode and an auxiliary gate electrode on either side thereof;

forming an oxide layer over the structure and etching the oxide layer to form sidewall oxide structures about the gate electrodes;

depositing a layer of material on the oxide layer taken from the group of material consisting of polysilicon, silicide and metal, patterning and etching the newly deposited layer of material; and metallizing the structure.

2. The method of claim 1 which includes, prior to said metallizing, doping the polysilicon with ions.

3. The method of claim 2 wherein said doping includes doping the polysilicon with boron ions at a dose of about $2 \cdot 10^{15}$ cm$^{-2}$, and an energy of about 15 keV, to form P+ silicon for a pMOST structure.

4. The method of claim 2 wherein said doping includes doping the polysilicon with phosphorous ions at a dose of about $2 \cdot 10^{15}$ cm$^{-2}$, and an energy of about 30 keV to form N+ silicon for a nMOST structure.

5. A method of forming an ultra-thin SOI MOS transistor structure comprising:

preparing a silicon-on-insulator (SOI) wafer, including forming a layer of oxide on a silicon wafer, forming a top silicon layer on the oxide surface wafer having a thickness of between about 100 nm to 200 nm, thinning the top silicon layer to a thickness of between about 10 nm to 30 nm using a method taken from the group of methods consisting of thermal oxidation and etching, and forming an oxide layer over the top silicon layer;

adjusting the threshold voltage of the structure by ion implantation into the top silicon layer 14, including implanting phosphorous ions, at a dose of between about $1 \cdot 10^{11}$ cm$^{-2}$ and $1 \cdot 10^{12}$ cm$^{-2}$, and an energy of 10 keV; and implanting boron ions, at a dose of between about $1 \cdot 10^{11}$ cm$^{-2}$ and $1 \cdot 10^{12}$ cm$^{-2}$, and an energy of 5 keV, to form N+ and P+ regions, respectively;

depositing an oxide layer over the top silicon layer;

depositing a layer of polysilicon by CVD forming an oxide cap over the polysilicon layer;

patterning and etching the oxide cap and the polysilicon to form a main gate electrode and two auxiliary gates alongside thereof; wherein the distance between the auxiliary gates and the main gate is about 200 nm;

depositing a layer of oxide by CVD or thermal oxidation to form an oxide layer having a thickness of between about 10 nm to 50 nm;

etching the lastly deposited oxide layer to form a sidewall oxide structure about the gate electrodes, wherein the sidewalls are a combination of the lastly deposited oxide, the second previously deposited oxide layer and the oxide cap;

depositing a layer of polysilicon by CVD to a thickness which is larger than one-half of the distance between the main gate and the auxiliary gates;

anisotropically etching the lastly deposited polysilicon layer to at least its endpoint, resulting in the remaining polysilicon layer being no thinner than about 50 nm;

patterning and plasma etching the structure to remove polysilicon at the sidewall of the gate electrodes outside of the source and drain active regions;

implanting ions to dope the sidewall polysilicon wherein the ions are taken from the group of ions consisting of phosphorous ions (N+) at a dose of about $2 \cdot 10^{15}$ cm$^{-2}$ and an energy level of about 30 keV, to form an nMOST, and boron ions (P+) at a dose of about $2 \cdot 10^{15}$ cm$^{-2}$ and an energy level of about 15 keV, to form a pMOST; thereby converting polysilicon gate electrodes into N+ or P+ silicon; and depositing by CVD an oxide layer; etching contact holes, and metallization.

* * * * *